United States Patent
Eldredge et al.

(10) Patent No.: US 7,512,203 B2
(45) Date of Patent: Mar. 31, 2009

(54) DATA CLEANING WITH AN ASYNCHRONOUS REFERENCE CLOCK

(75) Inventors: Adam B. Eldredge, Austin, TX (US); Yunteng Huang, Irvine, CA (US)

(73) Assignee: Silicon Laboratories Inc., Austin, TX (US)

( * ) Notice: Subject to any disclaimer, the term of this patent is extended or adjusted under 35 U.S.C. 154(b) by 598 days.

(21) Appl. No.: 11/093,903

(22) Filed: Mar. 30, 2005

(65) Prior Publication Data

US 2006/0222134 A1  Oct. 5, 2006

(51) Int. Cl.
  *H04L 7/00* (2006.01)
(52) U.S. Cl. .................. 375/371; 375/376; 375/372; 375/370
(58) Field of Classification Search ........... 375/376, 375/372, 371; 331/10, 16, 17, 2; 327/296; 716/6; 341/143; 455/76, 112, 314, 183.1
  See application file for complete search history.

(56) References Cited

U.S. PATENT DOCUMENTS

| | | | |
|---|---|---|---|
| 4,720,688 A * | 1/1988 | Hasegawa et al. ............... 331/2 |
| 5,152,005 A * | 9/1992 | Bickley ....................... 455/76 |
| 5,414,741 A * | 5/1995 | Johnson ...................... 375/376 |
| 5,752,175 A * | 5/1998 | Roullet et al. ............ 455/183.1 |
| 5,790,942 A * | 8/1998 | Le Corre et al. ............. 455/112 |
| 6,178,213 B1 | 1/2001 | McCormack et al. ....... 375/355 |
| 6,463,109 B1 | 10/2002 | McCormack et al. ....... 375/355 |
| 6,630,868 B2 | 10/2003 | Perrott et al. ................ 331/17 |
| 6,646,581 B1 * | 11/2003 | Huang ........................ 341/143 |
| 6,657,488 B1 | 12/2003 | King et al. ...................... 330/9 |
| 6,741,846 B1 | 5/2004 | Welland et al. ............. 455/260 |
| 6,765,445 B2 * | 7/2004 | Perrott et al. ................ 331/17 |
| 6,856,206 B1 | 2/2005 | Perrott ........................ 331/25 |
| 6,920,622 B1 * | 7/2005 | Garlepp et al. ................. 716/6 |
| 6,970,030 B1 * | 11/2005 | Huang et al. ................ 327/296 |
| 7,288,998 B2 * | 10/2007 | Thomsen et al. .............. 331/16 |
| 7,295,077 B2 * | 11/2007 | Thomsen et al. .............. 331/10 |
| 2002/0075981 A1 * | 6/2002 | Tang et al. .................. 375/372 |
| 2002/0186804 A1 * | 12/2002 | Dorschky et al. ........... 375/376 |
| 2004/0232995 A1 | 11/2004 | Thomsen et al. ............... 331/2 |

(Continued)

FOREIGN PATENT DOCUMENTS

WO  WO 2004/100380 A1  11/2004  ...................... 7/23

(Continued)

OTHER PUBLICATIONS

"A 5-Gb/s 0.25μm CMOS Jitter-Tolerant Variable-Interval Oversampling Clock/Data Recovery Circuit". Lee, Sang-Hyun; Moon-Sang Hwang, Youngdon Choi, Sungjoon Kim, Young-June Park, and Gijung Ahn. *IEEE Journal Of Solid-State Circuits*, vol. 37, No. 12, pp. 1822-1830. Dec. 2002.

(Continued)

*Primary Examiner*—Sudhanshu C Pathak
(74) *Attorney, Agent, or Firm*—Trop, Pruner & Hu, P.C.

(57) ABSTRACT

Embodiments of the present invention may provide for independent setting of jitter tolerance and jitter transfer levels, and reduced jitter generation of a data transmission device, such as a clock and data recovery (CDR) circuit or the like. An architecture may provide for reconfigurability of a circuit for use in various applications. The architecture may include a multi-loop structure, such as a tri-loop structure.

7 Claims, 5 Drawing Sheets

U.S. PATENT DOCUMENTS

2004/0253935 A1* 12/2004 Drentea .................. 455/314

OTHER PUBLICATIONS

"Rate-Independent CDR Chip Locks In At Up To 2.7 Gbits/s". Mannion, Patrick. *Electronic Design*. www.elecdesign.com. Mar. 20, 2000.

OC-48 Optical Networking Solutions—Solutions Guide. Silicon Laboratories. May 2003.

Si5022/23 Multi-Rate Sonet/SDH CDR IC with Integrated Limiting Amplifier—Product Brief. Silicon Laboratories. May 2001.

Si5010—Product Brief. Silicon Laboratories. Dec. 2004.

"Data conversion in SONET/SDH systems", A. Muhlschein. Electronics Engineer. Jun. 2000.

PCT/US2006/010414 International Search Report with Written Opinion of the International Searching Authority Mailed Jul. 19, 2006.

\* cited by examiner

DATA CLEANING WITH AN ASYNCHRONOUS REFERENCE CLOCK

FIELD OF THE INVENTION

The present invention relates to integrated circuits, and more specifically to integrated circuits used in data communication.

BACKGROUND

Digital communication systems are used to transmit data, often at high speeds and over long distances. At a receiving end, a circuit can be used to recover data along with a clock signal embedded in an incoming data stream. Such circuits are generally known as clock and data recovery (CDR) circuits, which recover an embedded clock and retime received data to the recovered clock. Typically, a phase-locked loop (PLL) is used to perform the clock recovery operation.

For many reasons, jitter, which is a fluctuation in the extracted clock signal from a constant rate, can occur. Jitter is to be controlled to reduce performance degradation, and some communication protocols include specifications as to allowable amounts of jitter. Different measures are used to characterize jitter within a system. Measures of jitter include jitter tolerance, jitter transfer and jitter generation.

Jitter tolerance is defined in terms of an applied jitter component whose amplitude, when applied to a system input, causes a certain level of degradation in error performance (e.g., bit error rate). The jitter amplitude is typically measured in unit intervals (UI), where one UI equals a single clock period. Thus jitter tolerance defines the jitter that is to be tolerated by a system when applied to an input of the system.

Jitter transfer is the ratio of the amplitude of a system's output signal jitter to an input signal jitter as a function of jitter frequency. As an example, for CDR circuits a jitter transfer function is typically a low pass filter with a low frequency gain of one. Finally, jitter generation is a measure of jitter at a system's output in the absence of input jitter. Ideally a system should handle significant incoming jitter (i.e., have a high jitter tolerance) while maintaining low jitter transfer and jitter generation levels. However, design tradeoffs exist that frustrate reaching this ideal.

Different communications standards have different requirements for jitter generation, jitter tolerance and jitter transfer. In typical CDR circuits, the jitter tolerance and jitter transfer are determined by the CDR loop bandwidth, and the tolerance and transfer cannot be individually adjusted. As a result, limited clock cleaning opportunities exist in a CDR, as the CDR must operate at the same jitter tolerance and jitter transfer levels.

A typical CDR architecture includes a phase detector to recover the data and to provide phase information that is used to generate a sampling clock. The sampling clock is then provided to a separate clock cleaning module or crystal oscillator to generate a retiming clock based on the sampling clock. However, an external clock cleaning module consumes board space and increases expense.

Furthermore, the clock cleaning module or crystal oscillator typically does not support multiple clock frequencies. As a result, for a single CDR circuit to support different frequencies of operation, multiple oscillators are needed. To support multiple frequency operations, the use of multiple oscillators requires additional board space, increasing size and cost. Furthermore, the oscillator frequency is required to be an integer division of the desired data rate.

SUMMARY OF THE INVENTION

In various embodiments, the present invention may provide independent setting of jitter tolerance and jitter transfer levels, and further may reduce jitter generation of a data transmission device, such as a clock and data recovery (CDR) circuit or the like. An architecture in accordance with one embodiment may provide for reconfigurability of a circuit for use in various applications, for example, at different frequencies and with different reference clock sources (or without a reference clock source). Further, a reference clock (if present) may be generated using a low-cost arbitrary frequency crystal, in some embodiments.

In one such embodiment, the architecture may include a first loop to receive incoming data and to generate a sampling clock signal, a second loop to generate a retiming clock signal based on an input reference signal, and a third loop coupled to supply a control signal to control the second loop. The architecture may further include a multi-modulus divider in the second loop. In some embodiments, each loop may include a loop filter, where the third loop filter is to operate at a bandwidth slower than the first and second loop filters.

In yet other embodiments, a CDR circuit may include a CDR loop to receive incoming data and recover a data signal and a sampling clock signal therefrom, and a clock generation loop coupled to the CDR loop to provide a retiming clock signal to the CDR loop. The retiming clock signal may be generated independently of the sampling clock signal, in some embodiments, and the clock generation loop may include a fractional N-divider. The CDR loop may set a jitter tolerance bandwidth and the clock generation loop may independently set a jitter transfer bandwidth.

Yet other embodiments may provide apparatus and methods for receiving an incoming signal and recovering data and a sampling clock from the incoming signal in a first loop, generating a retiming clock independently of the sampling clock, and transmitting the data using the retiming clock. The retiming clock may be controlled using a second loop and a third loop. Furthermore, an integrated circuit including the first loop, the second loop and the third loop may be configured to operate in different timing modes based on a given application.

Embodiments of the present invention may be implemented in appropriate hardware, firmware, and software. To that end, one embodiment may be implemented in a system for data transmission including a CDR or other circuitry, such as described above. Still other embodiments may include a system including such an integrated circuit along with additional components.

DETAILED DESCRIPTION

Figure 1:
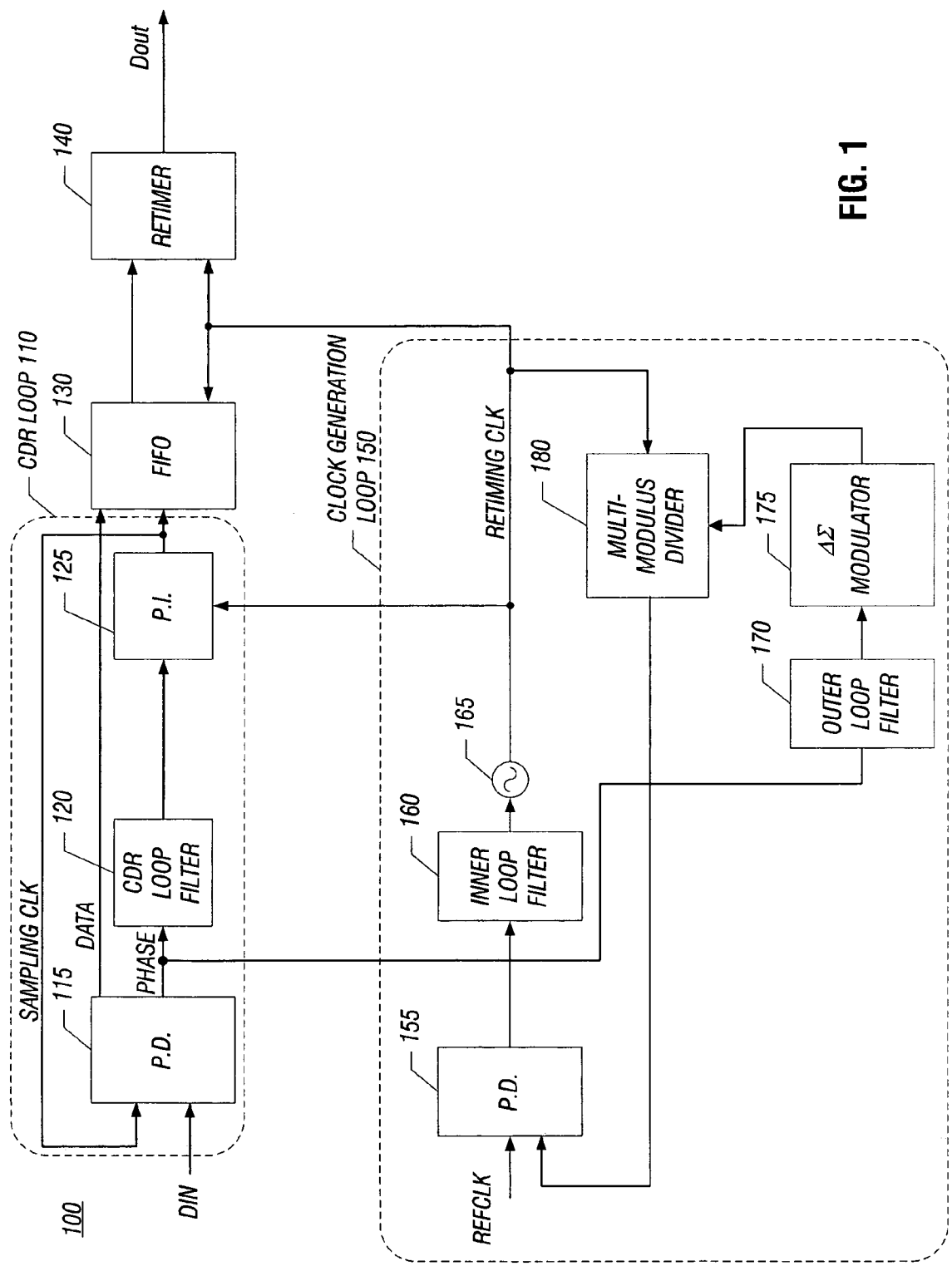
FIG. 1 is a block diagram of a clock and data recovery (CDR) circuit in accordance with one embodiment of the present invention.

Referring now to FIG. 1, shown is a block diagram of a clock and data recovery (CDR) circuit in accordance with one embodiment of the present invention. As shown in FIG. 1, CDR 100 may be used to recover data from an incoming signal ($D_{in}$) and further to recover a timing signal from the incoming signal. As an example, the incoming data may be high-speed serial data input at high data rates. A sampling clock is recovered from the incoming signal and is used to recover the data. The data is then sent out of CDR 100 as an output data signal ($D_{out}$). While not shown in FIG. 1, it is to be understood that CDR 100 may also output a clock signal (i.e., a retiming clock signal).

More specifically, as shown in FIG. 1, a CDR loop 110 recovers data according to a sampling clock, while a separate clock generation loop 150 generates a retiming clock based on phase information from CDR loop 110 and/or a reference clock provided to clock generation loop 150. The reference clock may be obtained from various sources. For example, in some embodiments the reference clock may be a clean or dirty reference clock (e.g., respectively having lower jitter or higher jitter). Alternately, the reference clock may come from a crystal oscillator, which may be a carefully selected integer-based oscillator. However, in other embodiments, a low-cost oscillator operating at an arbitrary frequency may be used, as embodiments of the present invention can generate a desired retiming clock signal using the low-cost oscillator. Furthermore, using a single reference clock, e.g., a single crystal, CDR 100 may operate at different frequencies. In such manner, reduced cost and board area may result. While not shown in FIG. 1, in various embodiments multiplexers and other switching circuits may be used to select different paths and sources for use in CDR 100.

Still referring to FIG. 1, CDR loop 110 includes a phase detector 115 coupled to receive the incoming signal ($D_{in}$). In various embodiments, the incoming signal includes both data and a clock signal embedded in the incoming signal. Phase detector 115 may be used to recover data from the incoming signal using data samplers (e.g., latch-type devices). In some embodiments, phase detector 115 may be a Hogge phase detector or a half-rate linear phase detector. In addition to the data samplers, phase detector 115 may include various logic gates. Thus in addition to recovering data, phase detector 115 may be used to obtain phase information. Specifically, phase information may be determined to indicate a phase error between a sampling clock and the incoming signal.

As further shown in FIG. 1, the phase information from phase detector 115 may be provided to a CDR loop filter 120. As will be discussed further below, in various embodiments loop filter 120 may operate at a relatively fast bandwidth to provide for high jitter tolerance. The filtered output of loop filter 120 may be provided to a phase interpolator 125, which is used to generate the sampling clock based on the filtered phase information and a retiming clock received from clock generation loop 150. As shown in FIG. 1, the sampling clock output from phase interpolator 125 is coupled in a feedback loop to phase detector 115 and is further coupled to a first-in first-out (FIFO) circuit 130. FIFO 130 may be used to provide buffering for the recovered data being input into FIFO 130, to absorb any jitter that may be present. The output of FIFO 130 is thus buffered data, which is provided to a retimer 140 along with the retiming clock to thereby output the data at the frequency of the retiming clock. The output data may then be provided to desired circuitry within a system such as data processing circuitry and the like.

As further shown in FIG. 1, clock generation loop 150 is coupled to receive an incoming reference clock. As discussed above, various frequencies and quality of clock signals may be used in connection with CDR 100. Further, in some embodiments clock generation loop 150 may operate without any reference clock as will be discussed below.

In the embodiment shown in FIG. 1, a phase detector 155 receives the incoming reference clock and a feedback signal that is a divided version of the retiming clock. The output of phase detector 155 is phase information, namely the phase error between the reference clock and the retiming clock. The phase information is provided to an inner loop filter 160. In various embodiments, inner loop filter 160 may operate at a medium bandwidth. The filtered phase information is then provided to an oscillator, such as a voltage controlled oscillator (VCO) 165 to generate a retiming clock signal. The retiming clock signal is provided to various locations, including phase interpolator 125 of CDR loop 110, FIFO 130 and retimer 140 of the data output path, and to a multi-modulus divider 180 of clock generation loop 150.

As further shown in FIG. 1, an outer loop filter 170 of clock generation loop 150 is coupled to receive phase information from phase detector 115 of CDR loop 110. In various embodiments, outer loop filter 170 may operate at a relatively slow bandwidth and may be used to enable low jitter transfer (i.e., clock cleaning ability). The filtered output of outer loop filter 170 is provided to a delta sigma ($\Delta\Sigma$) modulator 175, which modulates the filtered phase information and provides it to multi-modulus divider 180. Outer loop filter 170 and $\Delta\Sigma$ modulator 175 thus filter and noise shape the phase information from CDR loop 110 and provide the resulting signal to control multi-modulus divider 180. In various embodiments, multi-modulus divider 180 may be a fractional N-divider to provide phase feedback information to phase detector 155.

Thus as shown in FIG. 1, a tri-loop architecture is provided in which three different filters operate at different bandwidths, allowing independent jitter tolerance and jitter transfer bandwidths. CDR loop filter 120 may be set at a relatively fast bandwidth to provide a desired jitter tolerance level. Filter 160 may operate at a medium bandwidth, allowing VCO 165 to operate at a higher bandwidth, reducing jitter generation and susceptibility to injection locking. Finally, outer loop filter 170 may be set at a low bandwidth to provide for low jitter transfer bandwidth (i.e., clock cleaning). Use of three loop filters operating at different bandwidths thus allows jitter transfer bandwidth and jitter tolerance bandwidth to be set independently. In various embodiments, the relatively fast loop filter in CDR loop 110 may be present on both a transmit path and a receive path, allowing jitter transfer and tolerance bandwidth to be guaranteed, even with large variations in phase detector and VCO gains.

In various embodiments, a CDR may be programmable to allow a user to select different timing modes of operation based on a desired usage model. That is, different users may desire to use a CDR in different environments and with different design criteria. For example, CDRs in accordance with an embodiment of the present invention may be used to support different communication protocols and speeds including, for example, different optical carrier levels, such as OC-192, OC-192 with forward error correction (FEC), and 10 gigabit Ethernet, as examples. Furthermore, different timing modes allow a customer to trade-off jitter generation with jitter transfer.

Furthermore, users may desire to use a CDR with different reference clock inputs, including clean or dirty reference clocks or without any reference clock. In different environments, multiple oscillators may be present to handle different protocols or frequencies of operation. These different oscillators raise costs and increase board level size. By providing programmability of a CDR in accordance with an embodiment of the present invention, a single oscillator may be used. Furthermore, in some embodiments, a low-cost oscillator that can operate at an arbitrary frequency may be used, rather than more expensive oscillators, particularly oscillators designed to operate at an integer frequency.

While not shown in FIG. 1, it is to be understood that in some embodiments CDR 100 of FIG. 1 may include additional components, such as multiplexers and switches to enable different modes of operation. Furthermore, while not shown in FIG. 1, it is to be understood that control logic and registers or other storage media may be present to allow user control of the different modes of operation.

In one timing mode, a CDR may be used without a reference clock or using a dirty reference clock without a crystal oscillator. This dirty reference clock may be used only to center an associated VCO and as a reference for a loss of lock (LOL) indicator. Accordingly, a CDR may be implemented without use of a crystal, reducing costs and components. However, reduced filtering may be provided. For example, in some embodiments, a jitter transfer bandwidth of between approximately 62.5 kHz to 1500 kHz may be provided. In such embodiments, a CDR may have a typical jitter generation of approximately 5 $mUI_{rms}$.

Figure 2:
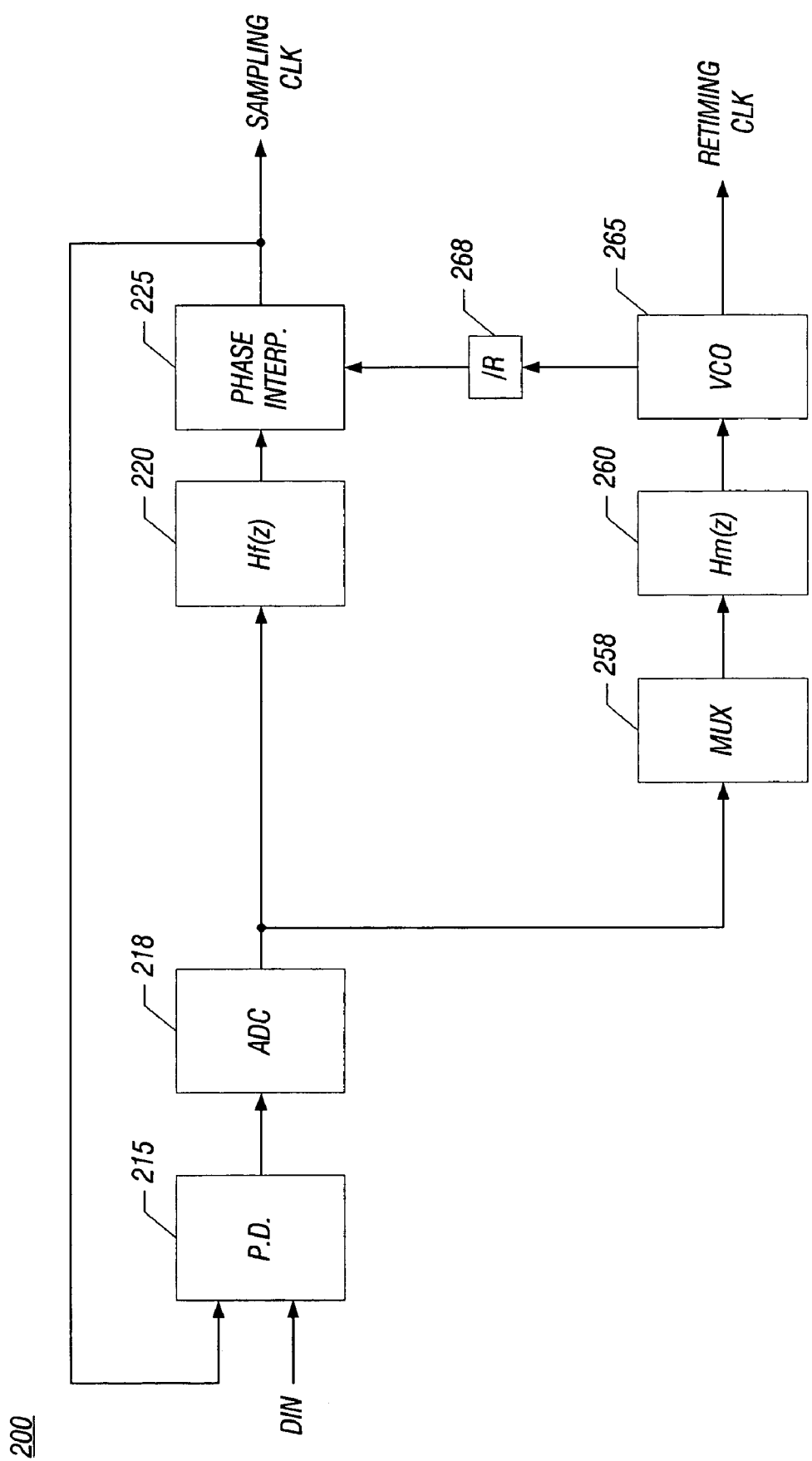
FIG. 2 is a block diagram of a portion of a CDR circuit in accordance with a first timing mode of operation.

Referring now to FIG. 2, shown is a block diagram of a portion of a CDR in accordance with a first timing mode of operation. This first timing mode may be referred to as a no reference clock or dirty reference clock mode. Specifically, circuit 200 allows for a CDR to operate without an associated crystal oscillator or reference clock, or use of a dirty reference clock without a crystal.

While shown as a separate circuit 200, it is to be understood that the general block diagram of FIG. 1 may implement this timing mode (with multiplexers and switching circuitry to select the proper inputs for the loops), however the circuit of FIG. 2 is shown for ease of illustration. As shown in FIG. 2, circuit 200 includes a CDR loop portion that includes a phase detector 215 coupled to receive an incoming signal ($D_{in}$), as well as a sampling clock fed back from an output of circuit 200. Phase detector 215 thus generates a phase error signal representative of a phase difference between the sampling clock and the incoming signal. Furthermore, the CDR loop includes an analog-to-digital converter (ADC) 218 to convert analog phase information obtained from phase detector 215 into a digital signal. The digital phase information may then be input into a loop filter 220. Note a data path of the CDR is not shown in FIG. 2 (an example data path is shown in FIG. 1).

In the embodiment of FIG. 2, loop filter 220 may be a digital filter, although the scope of the present invention is not so limited. That is, in other embodiments, ADC 218 may be removed, and analog phase information may be provided to a continuous time filter. In the embodiment of FIG. 2, loop filter 220 may be a single integration digital filter. In various embodiments, loop filter 220 may operate at a fast bandwidth. In some embodiments, the loop bandwidth may be between approximately 4 and 8 MHz (e.g., for OC-192 applications) and in one particular embodiment, the loop bandwidth may be approximately 6 MHz, although the scope of the present invention is not so limited.

The fast bandwidth of the CDR loop thus controls the jitter tolerance of the CDR. By setting the jitter tolerance level relatively high, improved jitter performance may be obtained. In some embodiments, CDR loop filter 220 may be a standard accumulator filter having a frequency domain of 1/s and a z domain of $1/(1-z^{-1})$. The filtered output of loop filter 220 is provided to a phase interpolator 225, which generates the sampling clock from the filtered phase information (and the retiming clock signal generated from the clock generation loop of FIG. 2).

As shown in FIG. 2, the clock generation loop of circuit 200 includes a multiplexer 258 to receive phase information from the CDR loop. Multiplexer 258 may be controlled to select from one of a number of inputs (not shown in FIG. 2) to provide an output to an inner loop filter 260. As discussed above, for the timing mode of FIG. 2, there may be no reference clock or crystal oscillator present. Accordingly, multiplexer 258 may be controlled to provide phase information from the CDR loop to inner loop filter 260. In the embodiment shown in FIG. 2, inner loop filter 260 is a digital filter, although the scope of the present invention is not so limited. In various embodiments, inner loop filter 260 may operate at a medium bandwidth. In various embodiments, the medium bandwidth may be between approximately 60 kHz and 1.5 MHz, although the scope of the present invention is not so limited. The medium bandwidth of inner loop filter 260 thus provides the bandwidth of jitter transfer for the CDR. Furthermore, by operating at a medium bandwidth, noise generation in the clock generation loop may be minimized.

In some embodiments, inner loop filter 260 may be a double integration filter having two accumulators. In this way, the phase information received by inner loop filter 260 is accumulated through two accumulators, adding an additional pole and zero. In such manner, the phase of the retiming clock generated in VCO 265 may be equal to the data phase. That is, both frequency and phase-lock between the retiming clock and the sampling clock may be achieved. Again, while inner loop filter 260 may be a digital filter, in other embodiments the inner loop filter may be an analog filter.

As further shown in FIG. 2, the filtered output of inner loop filter 260 is provided to VCO 265 that generates a retiming clock signal therefrom. The retiming clock signal may be used to retime data recovered from the incoming signal (i.e., $D_{in}$). Furthermore, as shown in FIG. 2, the retiming clock may be used to control the frequency of the sampling clock generated by phase interpolator 225 of the CDR loop. Specifically, as shown in FIG. 2, the retiming clock may be divided by a divider circuit 268. In one embodiment, divider circuit 268 may be a divide by two divider, although the scope of the present invention is not so limited. However, in other embodiments, the retiming clock undivided may be provided to phase interpolator 225.

Thus circuit 200 of FIG. 2 recovers data in an incoming signal and further digitizes phase information from the incoming signal, which is filtered and used to control a VCO, which in turn is used to control generation of a sampling clock. This operation may be implemented without use of a crystal oscillator. Furthermore, jitter tolerance and jitter generation may be set independently.

In other embodiments, a CDR may be used in a system where a clean reference clock is available. As an example, the clean reference clock may be a crystal of a selected frequency suitable for use in integer division. For example, the reference clock may be a 155 MHz clock that is used to develop a retiming clock at 10 GHz, although the scope of the present invention is not so limited. Using such a reference clock, the CDR may include a clock generation loop that acts as a clock multiplier unit (CMU). The retiming clock is generated independently of the sampling clock, allowing independent jitter tolerance and jitter transfer settings. That is, the jitter tolerance is set by the higher bandwidth CDR loop, while the jitter transfer is set by the clock generation loop. Additionally by using a clean reference clock, the jitter generation may be very low, as the clock generation loop may have a very wide bandwidth loop.

Figure 3:
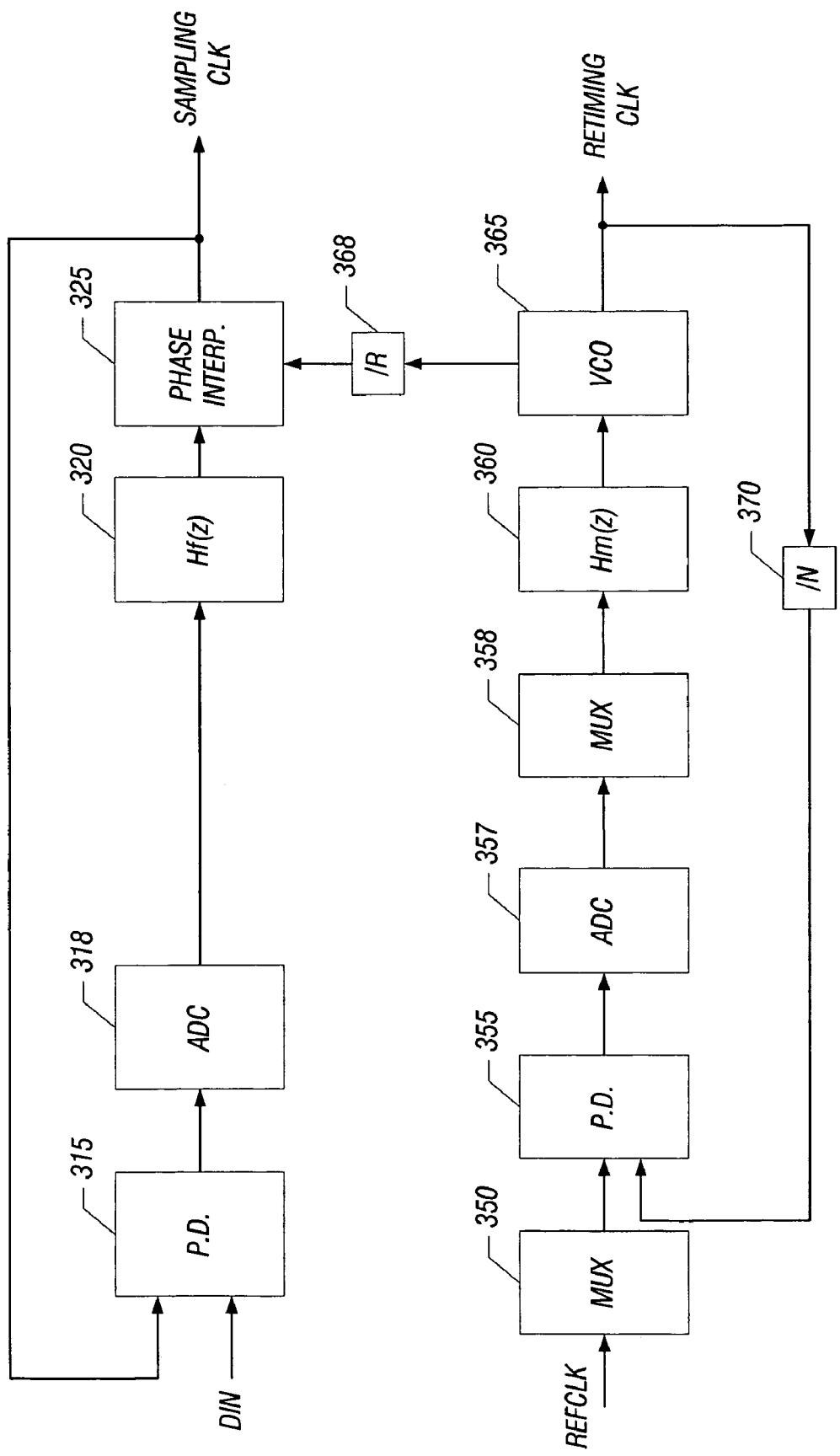
FIG. 3 is a block diagram of a portion of a CDR circuit in accordance with a second timing mode of operation.

Referring now to FIG. 3, shown is a block diagram of a portion of a CDR in accordance with a second timing mode that uses a clean reference clock. The clean reference clock in the embodiment of FIG. 3 may be a synchronous reference clock in that it operates at an integer multiple of a desired retiming clock. While shown as a separate circuit 300, it is to be understood that the general block diagram of FIG. 1 may implement this second timing mode (with multiplexers and switching circuitry to select the proper inputs for the loops), however the circuit of FIG. 3 is shown for ease of illustration.

Referring to FIG. 3, circuit 300 includes a CDR loop having a phase detector 315 that is coupled to receive an incoming signal ($D_{in}$). The output of phase detector 315 is coupled to an ADC 318 that generates digital phase information which is provided to a CDR loop filter 320 that filters the phase information and provides the filtered phase information to a phase interpolator 325, which generates the sampling clock therefrom. In various embodiments, loop filter 320 may operate at a relatively high bandwidth, e.g., 6 MHz.

As shown further in FIG. 3, the clock generation loop is entirely independent from the CDR loop. Accordingly, there is no jitter transfer from $D_{in}$ to $D_{out}$, as the retiming clock does not depend on the incoming data at all. Instead, the jitter transfer is from the reference clock to $D_{out}$. In this way, jitter generation can be very low as there is no noise transfer from $D_{in}$ to $D_{out}$. In some embodiments, the jitter generation in accordance with the embodiment of FIG. 3 may be approximately 1 $mUI_{rms}$.

Still referring to FIG. 3, the clock generation loop includes a multiplexer 350 coupled to receive the incoming reference clock and provide it to a phase detector 355. In turn, phase detector 355 is coupled to an ADC 357 which digitizes the phase information obtained from phase detector 355. The digitized phase information is then coupled through a multiplexer 358 to an inner loop filter 360. In various embodiments, inner loop filter 360 may be a digital filter and may be a single integration or multiple integration filter. In various embodiments, inner loop filter 360 may operate at a medium bandwidth, between approximately 750 kHz to 1500 kHz.

The output of filter 360 is used to control a VCO 365 that generates the retiming clock. In turn, the retiming clock is coupled through a divider 368 to phase interpolator 325 of the CDR loop. Furthermore, the retiming clock is fed to a divider 370, which may be an integer divider. In various embodiments, divider 370 may be a divide by 64, although the scope of the present invention is not so limited. The divided retiming clock is then fed back to phase detector 355 for use in determining a phase error between the retiming clock and the reference clock.

In yet other embodiments, a CDR may be used in a system having a clean reference clock or a crystal of any arbitrary frequency. That is, certain systems may reduce expense by using an arbitrary frequency crystal that is not an integer multiple of a retiming clock. As an example, a low-cost 40 MHz crystal or a 120 MHz third overtone crystal may be used. As described above with regard to FIG. 3, independent jitter transfer and jitter tolerance may be accommodated by use of separate reference clock and incoming data paths. Furthermore, a third loop filter may be provided to provide clock cleaning and to provide jitter transfer at a very low bandwidth.

Figure 4:
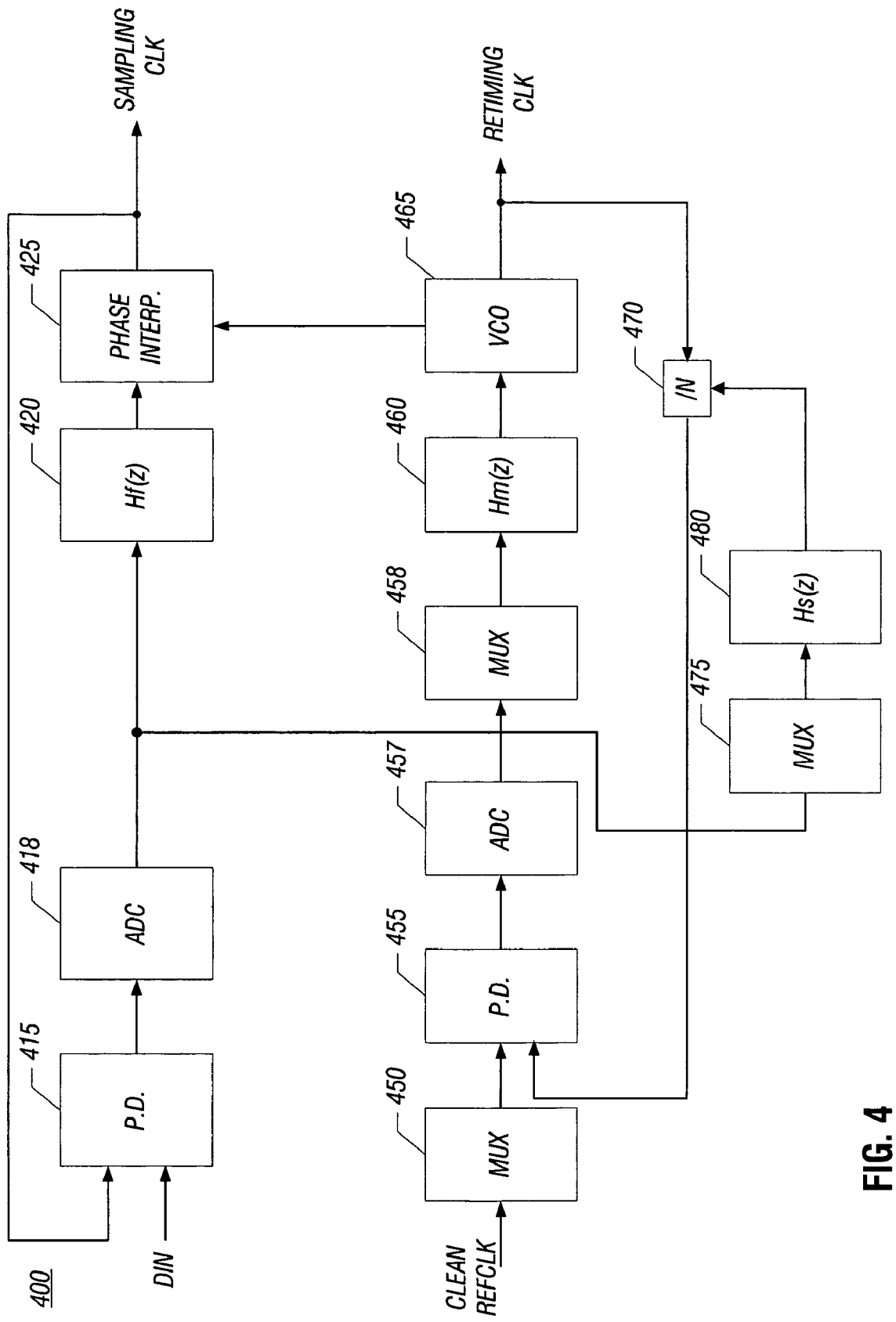
FIG. 4 is a block diagram of a circuit having a tri-loop architecture in accordance with an embodiment of the present invention.

Referring now to FIG. 4, shown is a block diagram of a circuit with a tri-loop architecture in accordance with an embodiment of the present invention. In the timing mode of FIG. 4, a clean, asynchronous reference clock may be provided in that the reference clock need not be an integer multiple of a desired retiming clock frequency. In different embodiments, the clean asynchronous reference clock may be provided with or without an associated crystal.

As shown in FIG. 4, circuit 400 includes a CDR loop, and a clock generation loop including an inner loop and an outer loop. By use of three loops, jitter tolerance and jitter transfer bandwidths may remain independent. Furthermore, the additional outer loop enables clock cleaning and low jitter transfer bandwidths. While shown as a separate circuit 400, it is to be understood that the general block diagram of FIG. 1 may implement this timing mode (with multiplexers and switching circuitry to select the proper inputs for the loops), however the circuit of FIG. 4 is shown for ease of understanding.

As shown in FIG. 4, the CDR loop includes a phase detector 415 to receive an incoming signal (i.e., $D_{in}$) along with feedback information from a sampling clock. The resulting phase information is coupled to an ADC 418, which provides the digitized phase information to a CDR loop filter 420. In some embodiments, filter 420 may be a digital filter operating at a relatively high bandwidth (e.g., approximately 6 MHz). The filtered output of loop filter 420 is coupled to a phase interpolator 425, which generates a sampling clock therefrom.

The clock generation loop includes an inner loop that receives a clean reference clock, for example from a crystal oscillator, via a multiplexer 450. In some embodiments, the crystal oscillator may be a low-cost arbitrary frequency crystal. The reference clock is provided to a phase detector 455, along with a divided version of the retiming clock, as will be discussed further below. The corresponding phase information from phase detector 455 is digitized in ADC 457 and is provided through a multiplexer 458 to an inner loop filter 460. In one embodiment, loop filter 460 may operate at a bandwidth of approximately 500 kHz, although in other embodiments the bandwidth of inner loop filter 460 may be between approximately 60 kHz to 1.5 MHz. The filtered output of loop filter 460 is coupled to a VCO 465, which generates the retiming clock therefrom. In addition to providing the retiming clock to output data, it is coupled to phase interpolator 425 of the CDR loop.

Furthermore, the retiming clock is provided as an input to a fractional N-divider 470. Fractional N-divider 470 may be controlled by the outer loop of the clock generation loop. Specifically, a multiplexer 475 is coupled to receive digitized phase information from ADC 418 of the CDR loop and provide it to an outer loop filter 480. In various embodiments, outer loop filter 480 may be a digital filter, and more specifically a double integration filter. The outer loop filter 480 may operate at very low bandwidths, for example, between approximately 50 Hz to 1.6 kHz. In one embodiment, outer loop filter 480 may operate at 200 Hz. This very low bandwidth thus provides extremely low jitter transfer bandwidth. The filtered output of outer loop filter 480 is thus used to control fractional N-divider 470, the output of which is provided to phase detector 455 where it is compared to the phase of the reference clock.

With the use of a fractional N phase-locked loop (PLL), the reference clock can be multiplied up by a rational number to supply a wide variety of output frequencies. The clock generation loop can thus be viewed as a digitally controlled oscillator, where the retiming clock frequency is controlled by the rational digital number M according to $F_{retiming\ clock} = M \times F_{refclk}$.

Fractional N phase-locked loops (PLLs) allow the multiplication of an incoming reference clock by a rational rather than an integer number as is common in traditional PLL designs. Such a multiplication thus may use a multi-modulus divider in the feedback path. Such a divider will divide not by a fixed integer, but by a sequence of integers that over time approximates the rational number desired. This sequence can be generated by a digital delta sigma modulator (e.g., ΔΣ modulator 175 of FIG. 1) which shapes the quantization noise added to the rational number with a high pass filter.

By using digital filters for the different loop filters of the CDR the loop filters may be integrated onto the integrated circuit of the CDR to reduce potential additional noise sources. Further, use of a digital loop filter allows an accurate implementation of the loop filter that is properly matched to the corners and the order of the noise shaping function and therefore can best reduce the jitter contribution (i.e., jitter generation) from that source.

In one embodiment, fractional N-divider 470 may be formed by a series of dividers. Because the feedback frequency may be in the GHz range, a prescalar may be used to divide the feedback signal by e.g., 4 or 5. Subsequent division stages, e.g., a plurality of divide by 4 and/or 5 stages may further divide the feedback signal to an appropriate value according to the desired divider value. Further details of an exemplary multi-modulus divider may be found in U.S. Patent Application Publication No. 2004/0232995, entitled Dual Loop Architecture Useful for a Programmable Clock Source and Clock Multiplier Applications by Axel Thomsen, Yunteng Huang, and Jerrell P. Hein, which is incorporated herein by reference.

Figure 5:
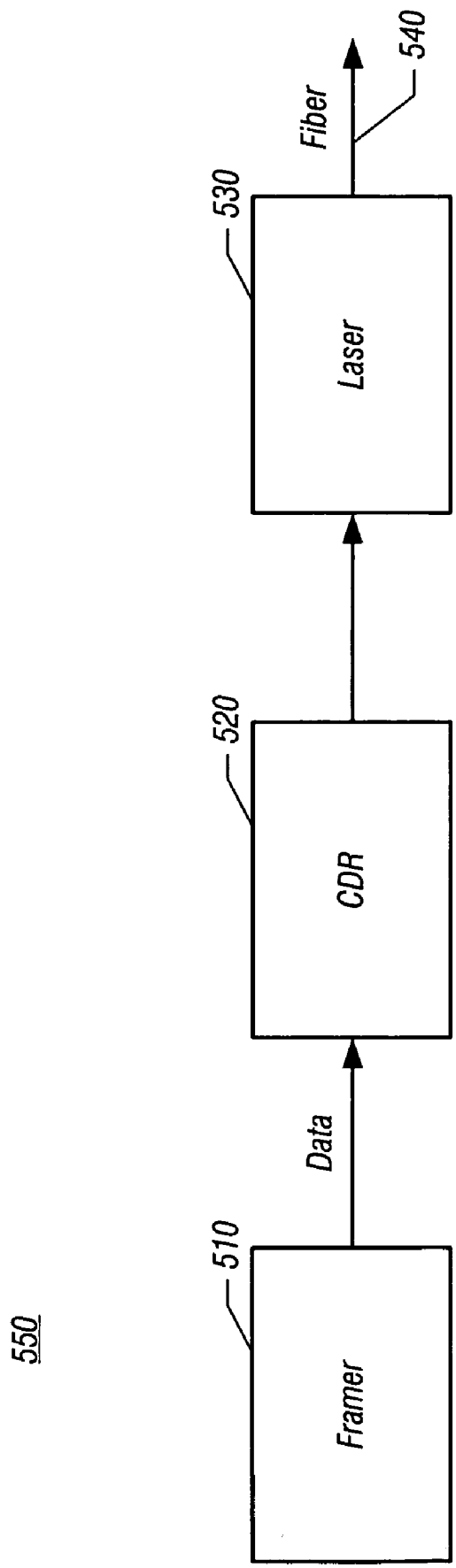
FIG. 5 is a block diagram of a portion of a system in accordance with one embodiment of the present invention.

Referring now to FIG. 5, shown is a block diagram of a portion of a system in accordance with one embodiment of the present invention. System 550 may be a part of an optical system, such as an optical transmitter or other optical device. As examples, system 550 may be a synchronous optical network (SONET), synchronous digital hierarchy (SDH), or asynchronous transfer mode (ATM) router, optical transceiver, regenerator or the like. As shown in FIG. 5, system 550 receives incoming data from a system, such as a computer system, line card or the like at a framer 510. Framer 510 may manipulate the data for serialization and pass the data to a CDR 520 to generate an outgoing signal including the data and an embedded clock. The outgoing signal is provided to an optical driver 530 which may be, for example a laser. In one embodiment, driver 530 may be a Mach-Zehnder laser, although the scope of the present invention is not so limited. Finally, the outgoing signal is sent along an optical fiber 540 to its target destination.

CDR 520 may include a tri-loop architecture in accordance with an embodiment of the present invention. Accordingly, CDR 520 may provide independent jitter tolerance and jitter transfer control, and may reduce jitter generation.

While shown with the particular components present in FIG. 5, it is to be understood that a system in accordance with an embodiment of the present invention may include additional components, and the components present in FIG. 5 may be differently arranged. For example, CDR 520 may be included in an integrated circuit with other functionality.

In certain embodiments, control of multiple loops of a CDR may be effected using software (or a combination of software, firmware and hardware) that may be executed within a system, such as a receiver, transmitter, CDR, or other component. Such embodiments may include an article in the form of a machine-readable storage medium onto which there are stored instructions and data that form a software program to perform such methods.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A clock and data recovery (CDR) circuit comprising:
a CDR loop to receive incoming data and recover a data signal and a sampling clock signal therefrom, the CDR loop including a first phase detector to recover the data signal responsive to the sampling clock signal generated in the CDR loop; and
a clock generation loop coupled to the CDR loop to provide a retiming clock signal to the CDR loop, and including an inner loop and an outer loop, the outer loop including a loop filter coupled to receive phase information from the CDR loop and a modulator to control a feedback path of the inner loop based on the phase information, the retiming clock signal generated independently of the sampling clock signal; and wherein the CDR loop is to set a jitter tolerance bandwidth and the clock generation loop is to independently set a jitter transfer bandwidth.

2. The CDR circuit of claim 1, wherein the clock generation loop includes a fractional N-divider.

3. The CDR circuit of claim 1, wherein the clock generation loop is to generate the retiming clock signal based on an independent reference clock, wherein the independent reference clock comprises an arbitrary frequency.

4. The CDR circuit of claim 1, wherein the clock generation loop includes a double integration loop filter.

5. The CDR circuit of claim 1, wherein the feedback path comprises a multi-modulus divider.

6. The CDR circuit of claim 1, wherein the CDR is configurable to operate in a plurality of timing modes.

7. The CDR circuit of claim 6, wherein one of the plurality of timing modes comprises a referenceless mode.

* * * * *